United States Patent
Haruyama

(10) Patent No.: US 6,625,422 B1
(45) Date of Patent: Sep. 23, 2003

(54) SIGNAL GENERATOR

(75) Inventor: Hiroaki Haruyama, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/570,294

(22) Filed: May 12, 2000

(30) Foreign Application Priority Data

May 13, 1999 (JP) ............................................. 11-132273

(51) Int. Cl.$^7$ .............................. H04L 27/20; H04B 1/38
(52) U.S. Cl. ........................... 455/73; 455/86; 455/552; 375/308; 341/120
(58) Field of Search ............................ 455/86, 118, 76, 455/131, 23, 21, 551, 411, 558, 565, 552, 3.01; 375/259, 308, 260, 295, 296, 300, 302; 331/183, 185–186; 332/103; 327/106, 105; 341/120; 340/505, 531; 725/120

(56) References Cited

U.S. PATENT DOCUMENTS

| | | | | |
|---|---|---|---|---|
| 4,258,436 A | * | 3/1981 | Campbell | 375/224 |
| 4,733,223 A | * | 3/1988 | Gilbert | 340/505 |
| 5,412,352 A | * | 5/1995 | Graham | 375/308 |
| 5,784,413 A | * | 7/1998 | Chen | 455/118 |
| 6,006,104 A | * | 12/1999 | Metroka et al. | 455/551 |
| 6,075,996 A | * | 6/2000 | Srinivas | 455/552 |
| 6,228,079 B1 | * | 5/2001 | Koenig | 606/34 |
| 6,266,816 B1 | * | 7/2001 | Watson et al. | 725/120 |
| 6,271,737 B1 | * | 8/2001 | Watkinson | 455/260 |
| 6,429,796 B1 | * | 8/2002 | Buckley | 341/120 |

* cited by examiner

Primary Examiner—Dwayne Bost
Assistant Examiner—Kamran Afshar
(74) Attorney, Agent, or Firm—RatnerPrestia

(57) ABSTRACT

A signal generator for generating a high frequency without using a VCO and a loop filter is disclosed. A digital signal tapped off from a digital synthesizer generating a digital signal corresponding to a desired frequency is converted into an analog signal by a D/A converter. This signal is deprived of its unwanted wave signal components by a bandpass filter, and the analog signal thus obtained is used as an RF signal. A frequency-multiplied signal of an output signal of a reference signal generator generating the reference signal is supplied to a mixer as a local oscillation signal. The mixer mixes the RF signal supplied thereto with the local oscillation signal to frequency-convert the signals into a high-frequency signal. The high-frequency signal is deprived of its out-of-band noises by a filter to provide a local oscillation signal for use in a communication apparatus.

13 Claims, 4 Drawing Sheets

SIGNAL GENERATOR

FIELD OF THE INVENTION

The present invention relates to a generator of such signals as a local oscillation signal and a carrier wave signal for use in a high-frequency communication apparatus for satellite communications and the like.

BACKGROUND OF THE INVENTION

A signal generator capable of stably generating a carrier wave or a local oscillation signal of a high frequency is indispensable for a communication apparatus for use in communication systems such as satellite communications, in which communications are made at a frequency band of high frequency such as a microwave. Further, when such a signal generator is to be used on a mobile member such as a vehicle, it is desired that the signal generator be resistive to vibration.

A conventional signal generator, well known in the market, is described hereinafter.

FIG. 4 is a block diagram showing the conventional signal generator.

In FIG. 4, Phase Lock Loop (PLL) 1 is connected to the frequency control terminal of Voltage Controlled Oscillator (VCO.) 2 through loop filter 3. Output signal 22 of VCO. 2 is split into two portions, of which one is delivered to outside and the other is supplied to the feedback terminal of PLL 1. VCO. 2 is capable of changing the oscillation frequency freely in accordance with the voltage applied to the frequency control terminal.

When a power supply to VCO. 2 is turned ON, a signal of a frequency is generated. The signal generated at this time is unstable and its frequency varies at all times. To stabilize the frequency, a channel setting signal is applied from outside so that the frequency is fixed at a certain level. When the externally applied channel setting signal is fed to PLL 1, PLL 1 varies its output voltage 12 to loop filter 3 thereby fixing the frequency at the certain level. Loop filter 3 smoothes the variation of this voltage 12 and outputs frequency-control-voltage 32 of VCO. 2. VCO. 2 oscillates a signal of the frequency corresponding to voltage 32 applied to the frequency control terminal, and returns the signal to the feedback terminal of PLL 1. PLL 1, again, varies output voltage 12 so as to regulate the frequency. By repeating the operation discussed above, a stabilized signal fixed at a desired frequency can be generated.

In the conventional signal generator as described above, however, the VCO. and the loop filter show great variation in characteristics due to vibration.

Because the frequency of the VCO.-generating signal is vulnerable to the vibration, the feedback operation by means of the above loop construction cannot follow the frequency-changes caused by the vibration.

Accordingly, the signal generator is subjected to great variations in output frequency due to vibration. Therefore, when a signal generator as described above is used in a system of a mobile member such as a vehicle, the system has sometimes required a component such as a damper.

SUMMARY OF THE INVENTION

It is an object of the invention to provide a signal generator capable of generating a high frequency for use in satellite communications and the like and free from being affected by vibration.

The signal generator of the invention is constructed as described below.

A digital synthesizer generates a digital signal representative of data corresponding to a desired frequency by means of a logical circuit. A D/A converter converts the digital signal into an analog signal. A bandpass filter eliminates unwanted wave signal components from the analog signal to provide a Radio Frequency (RF) signal. A mixer mixes the RF signal with a local oscillation signal, obtained by frequency-multiplying a reference signal generated from a reference signal generator, to frequency-convert the signals into a high-frequency signal. An output filter eliminates out-of-band noises from the high-frequency signal. The signal generator of the invention delivers the output signal of the output filter.

By the construction as described above, a signal generator capable of generating a high-frequency, without being affected by vibration, can be embodied.

The output signal of this signal generator is useful as a local oscillation signal and a carrier signal in a communication apparatus on a mobile member or the like for use in satellite communications.

DESCRIPTION OF THE PREFERRED EMBODIMENTS

Embodiment 1

Figure 1:
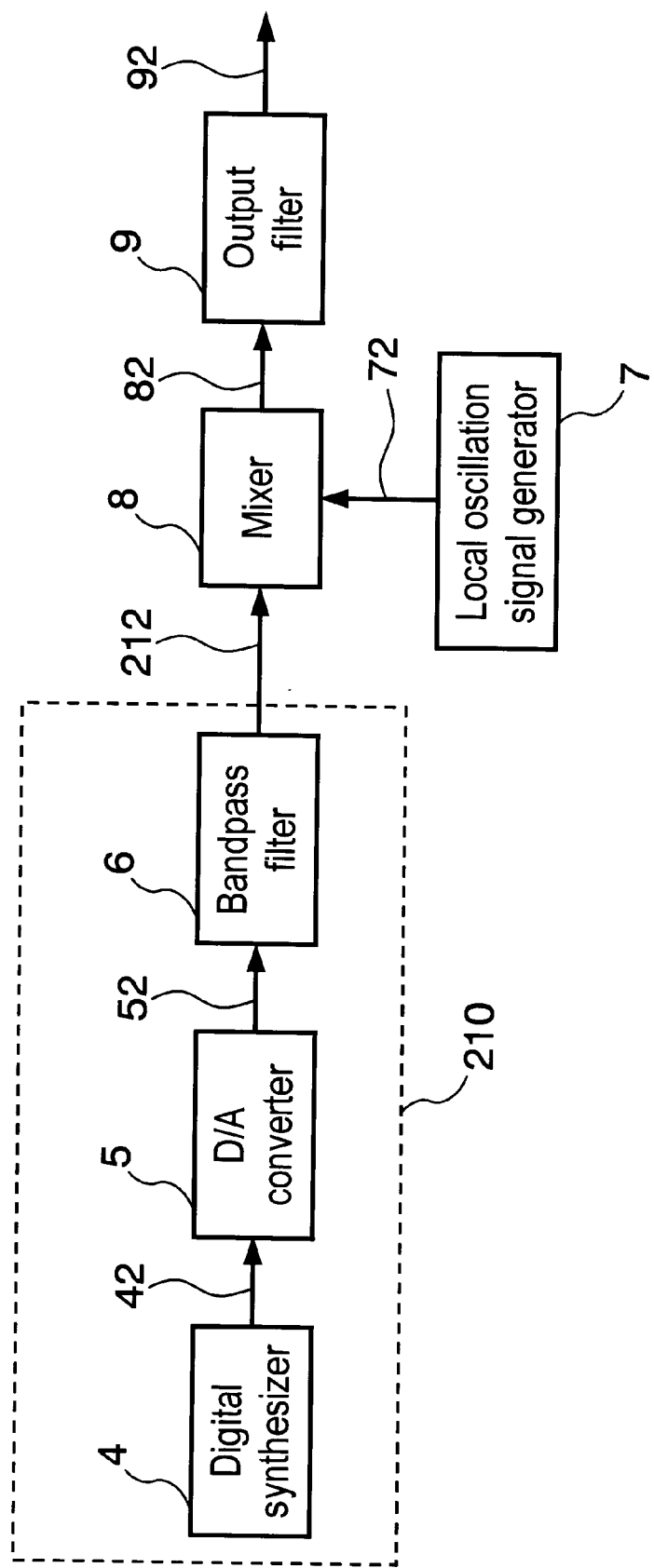
FIG. 1 is a block diagram of a signal generator according to embodiment 1 of the invention.

In FIG. 1, RF signal generator 210 comprises digital synthesizer 4, D/A converter 5, and bandpass filter 6. Output signal 42 of digital synthesizer 4 is supplied to D/A converter 5. Output signal 52 of D/A converter 5 is supplied to bandpass filter 6. Output signal 212 of bandpass filter 6 and output signal 72 of local oscillation signal generator 7 are supplied to mixer 8. Output signal 82 of mixer 8 is supplied to output filter 9.

Operations will be described. Digital synthesizer 4 generates digital signal 42 representative of data corresponding to a desired frequency by means of a logical circuit. D/A converter 5 converts digital signal 42 into analog signal 52 of a desired frequency. Bandpass filter 6 turns analog signal 52 into RF signal 212 free from unwanted wave signal components. Thus, RF signal generator 210 generates RF signal 212 of a desired frequency.

Local oscillation signal generator 7 generates a reference signal by means of a reference signal generator and supplies a frequency-multiplied signal of the reference signal to mixer 8 as local oscillation signal 72. Mixer 8 mixes RF signal 212 from bandpass filter 6 with local oscillation signal 72 to frequency-convert the signals into high-frequency signal 82. Output filter 9 outputs this high-frequency signal 82 having its out-of-band noises eliminated therefrom. Output signal 92 is used in a communication apparatus as a local oscillation signal or a carrier signal.

It may also be possible to eliminate unwanted wave signal components from output signal 72 of local oscillation signal generator 7 by means of a filter.

Further, the reference signal described above can be also used as the reference signal for the digital signal processing portion of the signal generator.

In the present embodiment:

1) RF signal generator 210, formed of digital synthesizer 4, D/A converter 5, and bandpass filter 6, is free from being affected by vibration. Further, since it does not employ a feedback loop, there is no problem of the speed of response to the frequency variation due to vibration.

2) When it is attempted to generate an RF signal based on a digital signal, it is difficult in principle to obtain a high frequency. In the structure as described above, however, RF signal 212 obtained in RF signal generator 210 is converted into signal 82 of higher frequency by means of mixer 8. Therefore, a high-frequency signal of the frequency required of the local oscillation signal and carrier wave signal for use in a communication apparatus can be obtained.

3) By protecting the reference signal generator in local oscillation signal generator 7 and the reference signal generator in the digital signal processing portion (as described previously, one generator may function as these two generators) from vibration by means of a damper, this signal generator can be further resistive to vibration.

Thus, a signal generator generating a high-frequency signal and resistive to vibration can be realized.

Embodiment 2

The signal generator of this embodiment generates a local oscillation signal adapted to a communication apparatus having different frequencies for its transmission system and reception system and performing transmission and reception on a time-division basis.

Figure 2:
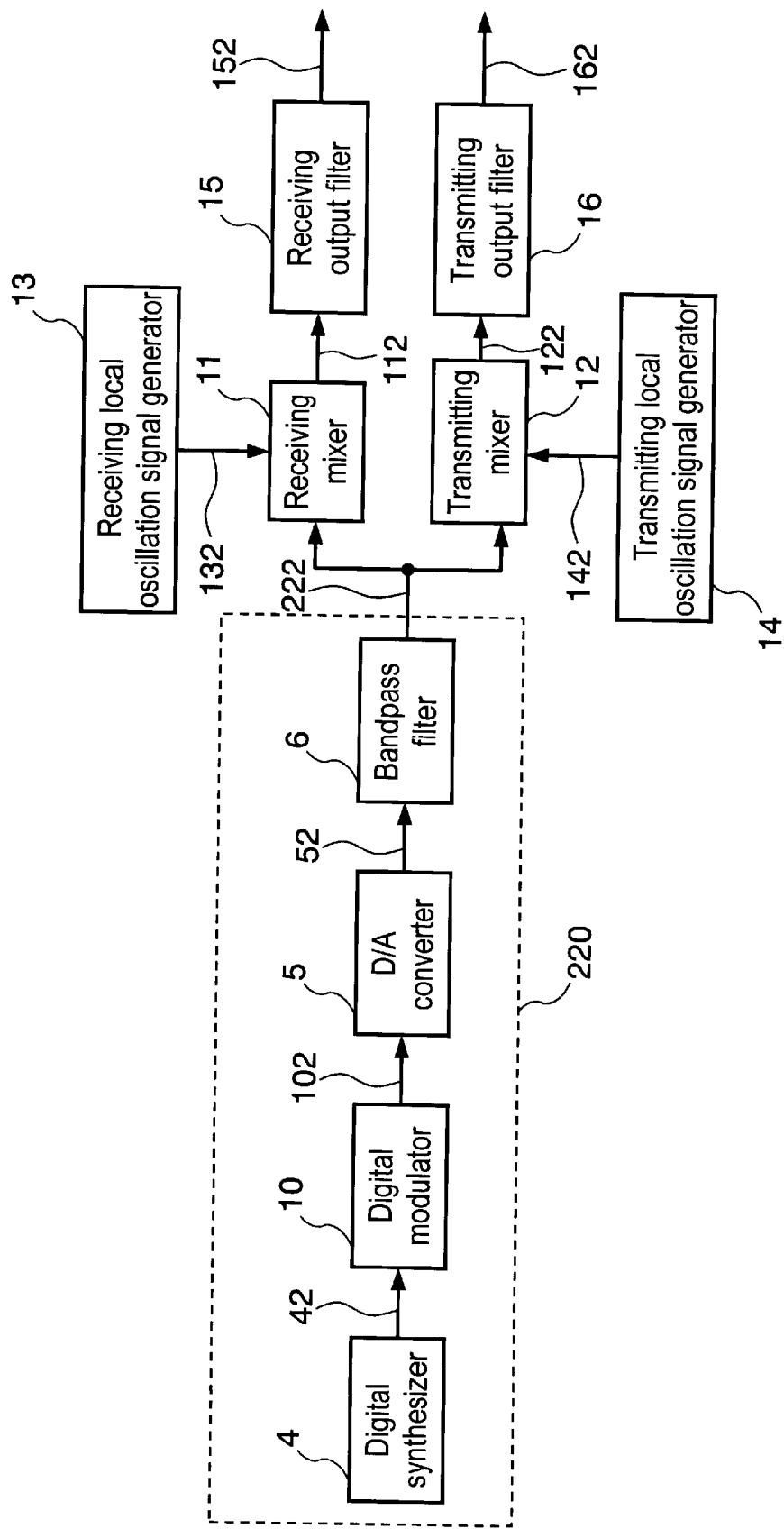
FIG. 2 is a block diagram of a signal generator according to embodiment 2 of the invention.

In FIG. 2, RF signal generator 220 comprises a digital modulator 10 in addition to RF signal generator 210 of the configuration in embodiment 1. Output signal 42 of digital synthesizer 4 is supplied to digital modulator 10. Output signal 102 of digital modulator 10 is supplied to D/A converter 5. Output signal 52 of D/A converter 5 is supplied to bandpass filter 6. Output signal 222 of bandpass filter 6 is supplied to reception mixer 11 and transmission mixer 12. Further, output signals 132 and 142 of reception local oscillation signal generator 13 and transmission local oscillation signal generator 14 are supplied to reception mixer 11 and transmission mixer 12, respectively. Output signals 112 and 122 of reception mixer 11 and transmission mixer 12 are supplied to reception output filter 15 and transmission output filter 16, respectively.

RF signal generator 220 switches the frequency of output RF signal 222 between that for transmission use and that for reception use in the manner as described below.

For the transmission use, digital modulator 10 digitally modulates digital signal 42 generated in digital synthesizer 4 to obtain a digital signal corresponding to another desired frequency. For the reception use, digital modulator 10 outputs that digital signal 42 unmodulated. D/A converter 5 converts such digital signal 102 into analog signal 52. Bandpass filter 6 eliminates unwanted wave signal components from analog signal 52, splits the thus obtained signal into two systems, i.e., one for reception and the other for transmission, and supplies the signals to reception mixer 11 and transmission mixer 12.

Reception local oscillation signal generator 13 and transmission local oscillation signal generator 14 generate their respective reference signals by means of their respective reference signal generators and supply signals obtained by frequency-multiplication of these reference signals to reception mixer 11 and transmission mixer 12 as local oscillation signals 132 and 142.

Reception mixer 11 mixes output signal 132 of reception local oscillation signal generator 13 with output signal 222 of bandpass filter 6 to convert the signals into high-frequency signal 112. Transmission mixer 12 mixes output signal 142 of transmission local oscillation signal generator 14 with output signal 222 of bandpass filter 6 to convert the signals into high-frequency signal 122.

In order to take out only the multiplied wave of the reference frequency in the reference signal oscillation, output signals 132 and 142 of reception local oscillation signal generator 13 and transmission local oscillation signal generator 14 may be passed through a filter and supplied to reception mixer 11 and transmission mixer 12.

Unwanted wave signal components are eliminated from output signal 112 of reception mixer 11 and output signal 122 of transmission mixer 12 by means of reception output filter 15 and transmission output filter 16, respectively. Output signals 152 and 162 of filters 15 and 16 are used as local oscillation signals of the communication apparatus for reception and transmission uses, respectively.

As described above, it is achieved to generate local oscillation signals adapted to a communication apparatus which has different frequencies for its reception system and transmission system and performs transmission and reception on a time-division basis. Since the signal generator of the present embodiment has an independent mixer for each of the reception and transmission uses, it can also be applied to a communication apparatus in which the local oscillation signals for reception and transmission are considerably different. As with the signal generator of embodiment 1, the signal generator of the present embodiment can embody a signal generator capable of generating a high-frequency signal and resistive to vibration.

If RF signal generator 220 is replaced with RF signal generator 210 shown in embodiment 1, this embodiment can also be applied to a communication apparatus performing transmission and reception at the same time.

Embodiment 3

Signal generator of this embodiment also generates local oscillation signals adapted to a communication apparatus having different frequencies for its transmission system and reception system and performing transmission and reception on a time-division basis. In the present embodiment, it is arranged such that the local oscillation signals used for transmission and reception are signals of the same band.

Figure 3:
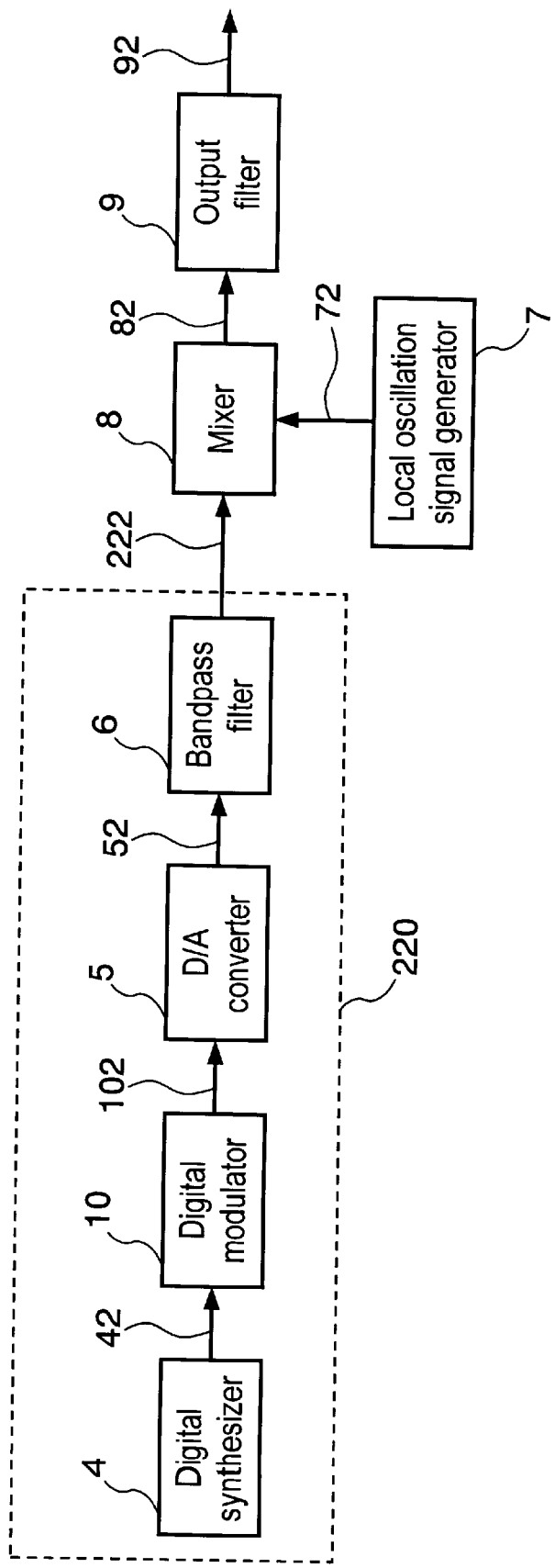
FIG. 3 is a block diagram of a signal generator according to embodiment 3 of the invention.
Figure 4:
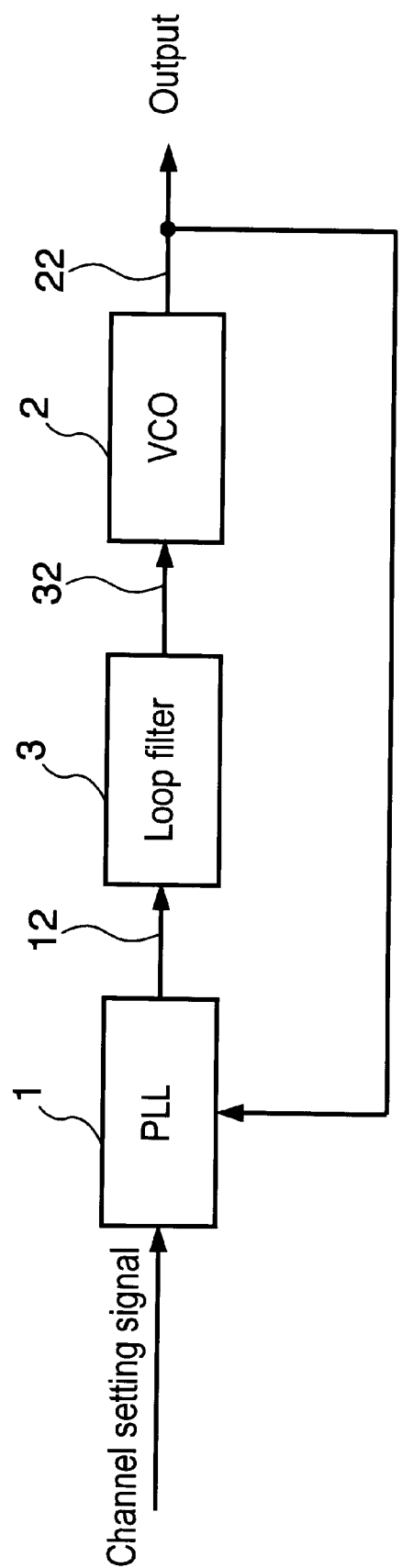
FIG. 4 is a block diagram of a prior art signal generator.

In FIG. 3, RF signal generator 220 has digital modulator 10 in addition to the configuration shown in FIG. 1. The remaining portion is of the same configuration as that shown in FIG. 1. This RF signal generator 220 switches the frequency of output RF signal 222 between that for transmission use and that for reception use by performing the same operation as described in embodiment 2.

As described above, the signal generator of the present embodiment can generate local oscillation signals adapted to a communication apparatus having different frequencies for its reception system and transmission system and performing transmission and reception on a time-division basis. Further, in this signal generator, the circuits for reception and transmission can be provided by one common circuit.

Further, the signal generator of the present embodiment, as with the signal generator of embodiment 1, can realize a signal generator capable of generating a high-frequency signal and resistive to vibration.

As described above, the signal generator of the present invention is (i) capable of generating such a high-frequency signal that can be used in a communication apparatus for satellite communications and (ii) free from being affected by vibration, hence applicable to a mobile member.

In addition to the above, the signal generator of the present invention can also generate local oscillation signals adapted to a communication apparatus having different frequencies for its reception system and transmission system.

Further, in the case of a communication apparatus for use in a communications system performing transmission and reception on a time-division basis and having the frequencies of the local oscillation signals for transmission and reception adjusted to be of the same band, the circuits for reception and transmission can be commonly used for both the functions.

What is claimed is:

1. A signal generator for generating a local oscillation signal for use in a communication apparatus, said generator comprising:

an RF signal generator for generating a Radio Frequency (RF) signal in response to a digital signal corresponding to a desired frequency, said RF signal generator comprising:
      i) a digital synthesizer for generating the digital signal;
      ii) a digital modulator for outputting one of the digital signal and a modulated digital signal obtained by modulating the digital signal;
      iii) a D/A converter for converting an output signal of said digital modulator into an analog signal; and
      iv) a bandpass filter for outputting the RF signal extracted from the analog signal, wherein
         said digital modulator is switched to output one of the digital signal and the modulated digital signal depending on whether the communication apparatus is receiving a signal or transmitting a signal;
   a local oscillation signal generator for generating a local oscillation signal;
   a mixer for mixing the local oscillation signal with the RF signal thereby frequency-converting the signals into a high-frequency signal; and
   a filter for outputting the high-frequency signal having its out-of-band signal components eliminated therefrom, wherein
      the output signal of said filter is delivered as the local oscillation signal for use in the communication apparatus.

2. The signal generator according to claim 1, wherein said RF signal generator comprises:
   i) a digital synthesizer for generating the digital signal;
   ii) a D/A converter for converting the digital signal into an analog signal; and
   iii) a bandpass filter for outputting the RF signal extracted from the analog signal.

3. The signal generator according to claim 1, wherein said RF signal generator switches the frequency of the RF signal outputted therefrom depending on whether the communication apparatus is receiving a signal or transmitting a signal.

4. The signal generator according to claim 1, further comprising:
   another local oscillation signal generator for generating another local oscillation signal;
   another mixer for mixing the another local oscillation signal with the RF signal thereby frequency-converting the signals into another high-frequency signal; and
   another filter for outputting the another high-frequency signal having its out-of-band signal components eliminated therefrom, wherein
      the output signal of said filter is delivered as the local oscillation signal for reception use in the communication apparatus and the output signal of said another filter is delivered as the local oscillation signal for transmission use in the communication apparatus.

5. The signal generator according to claim 1, wherein the local oscillation signal is a signal whose frequency is a multiple of the frequency of a reference signal.

6. The signal generator according to claim 2, wherein the local oscillation signal is a signal whose frequency is a multiple of the frequency of a reference signal.

7. The signal generator according to claim 1, wherein the local oscillation signal is a signal whose frequency is a multiple of the frequency of a reference signal.

8. The signal generator according to claim 3, wherein the local oscillation signal is a signal whose frequency is a multiple of the frequency of a reference signal.

9. The signal generator according to claim 4, wherein the local oscillation signal is a signal whose frequency is a multiple of the frequency of a reference signal, and
   the another local oscillation signal is a signal whose frequency is a multiple of the frequency of another reference signal.

10. A signal generator for generating a local oscillation signal for use in a communication apparatus, said generator comprising:
    an RF signal generator for generating a Radio Frequency (RF) signal in response to a digital signal corresponding to a desired frequency;
    a local oscillation signal generator for generating a local oscillation signal;
    a mixer for mixing the local oscillation signal with the RF signal thereby frequency-converting the signals into a high-frequency signal; and
    a filter for outputting the high-frequency signal having its out-of-band signal components eliminated therefrom, wherein the output signal of said filter is delivered as the local oscillation signal for use in the communication apparatus;
    another local oscillation signal generator for generating another local oscillation signal;
    another mixer for mixing the another local oscillation signal with the RF signal thereby frequency-converting the signals into another high-frequency signal; and
    another filter for outputting the another high-frequency signal having its out-of-band signal components eliminated therefrom, wherein
       the output signal of said filter is delivered as the local oscillation signal for reception use in the communication apparatus and the output signal of said another filter is delivered as the local oscillation signal for transmission use in the communication apparatus.

11. The signal generator according to claim 10, wherein said RF signal generator comprises:
    i) a digital synthesizer for generating the digital signal;
    ii) a D/A converter for converting the digital signal into an analog signal; and
    iii) a bandpass filter for outputting the RF signal extracted from the analog signal.

12. The signal generator according to claim 10, wherein the local oscillation signal is a signal whose frequency is a multiple of the frequency of a reference signal.

13. The signal generator according to claim 11, wherein the local oscillation signal is a signal whose frequency is a multiple of the frequency of a reference signal.

* * * * *